US008611161B2

(12) United States Patent
Oh

(10) Patent No.: US 8,611,161 B2
(45) Date of Patent: Dec. 17, 2013

(54) INTEGRATED CIRCUIT, SYSTEM INCLUDING THE SAME, MEMORY, AND MEMORY SYSTEM

(75) Inventor: Seung-Min Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 39 days.

(21) Appl. No.: 13/334,016

(22) Filed: Dec. 21, 2011

(65) Prior Publication Data

US 2012/0170383 A1    Jul. 5, 2012

(30) Foreign Application Priority Data

Dec. 30, 2010    (KR) .................. 10-2010-0138840

(51) Int. Cl.
*G11C 7/10* (2006.01)
(52) U.S. Cl.
USPC ................................. 365/189.05; 365/189.09
(58) Field of Classification Search
USPC ....................................... 365/189.05, 189.09
See application file for complete search history.

(56) References Cited

U.S. PATENT DOCUMENTS

| | | | | |
|---|---|---|---|---|
| 4,987,319 | A * | 1/1991 | Kawana | 326/37 |
| 6,825,698 | B2 * | 11/2004 | Wang et al. | 327/108 |
| 8,069,293 | B1 * | 11/2011 | Rogan et al. | 710/301 |
| 2002/0091977 | A1 * | 7/2002 | Mastro et al. | 714/712 |
| 2003/0193355 | A1 * | 10/2003 | Leifso et al. | 327/115 |
| 2008/0104290 | A1 * | 5/2008 | Cowell et al. | 710/71 |

FOREIGN PATENT DOCUMENTS

| | | |
|---|---|---|
| KR | 1020030070325 | 8/2003 |
| KR | 1020080043163 | 5/2008 |

OTHER PUBLICATIONS

Office Action issued from the Korean Intellectual Property Office on Aug. 29, 2012.

* cited by examiner

*Primary Examiner* — Michael Tran
(74) *Attorney, Agent, or Firm* — IP & T Group LLP

(57) ABSTRACT

A system includes integrated circuit chip including a first buffer configured to receive signals and a second buffer configured to receive signals, wherein the first buffer receives signals of a higher frequency than the second buffer, a controller chip configured to control the integrated circuit chip, an I/O channel formed between the controller chip and the integrated circuit chip to transfer a first signal and a second speed signal, wherein the first signal has a higher frequency than the second signal, and a status channel formed between the controller chip and the integrated circuit chip to transfer at least one status signal, wherein the integrated circuit chip is configured to select one of the first buffer and the second buffer and actives the selected buffer in response to the at least one status signal and receive a signal transferred through the I/O channel.

21 Claims, 8 Drawing Sheets

INTEGRATED CIRCUIT, SYSTEM INCLUDING THE SAME, MEMORY, AND MEMORY SYSTEM

CROSS-REFERENCE TO RELATED APPLICATIONS

The present application claims priority of Korean Patent Application No. 10-2010-0138840, filed on Dec. 30, 2010, which is incorporated herein by reference in its entirety.

BACKGROUND

1. Field

Exemplary embodiments of the present invention relate to technology capable of controlling a buffer for receiving data of a channel when a high speed signal and a low speed signal are applied to one channel.

2. Description of the Related Art

Buffers are circuits that receive signals input to an integrated circuit chip. A buffer capable of receiving (recognizing) a signal input at a high speed (high frequency) generally consumes a large amount of current. However, a buffer capable of receiving a signal input at a low speed (low frequency) generally consumes a small amount of current.

A command and an address, which are low speed signals, or data, which is a high speed signal, may be applied to an I/O pin of a flash memory. If a high speed type buffer is used to receive a signal input to the I/O pin, a logic level of the signal may be normally recognized, but a large amount of current may be consumed. Furthermore, if a low speed type buffer is used to receive the signal applied to the I/O pin, current consumption may be reduced, but a logic level of a high speed input signal may not be recognized. In this regard, technology including the features of recognizing high and low speed data and reducing current consumption may be useful. All kinds of integrated circuits for receiving a high speed signal or a low speed signal to one pin may benefit from such useful features, including a flash memory.

FIG. 1A is a diagram illustrating an inverter-type buffer, which is one of low speed-type buffers, and FIG. 1B is a diagram illustrating an amplifier-type buffer, which is one of high speed-type buffers.

Referring to FIG. 1A, the inverter-type buffer includes PMOS transistors 101, 102, 104 and 105 and NMOS transistors 103, 106, and 107.

When an on/off signal ON/OFF is at a 'low' logic level, the PMOS transistors 101 and 104 are turned on, so that the inverter-type buffer is activated.

When the inverter-type buffer is activated and an input signal IN has a high logic level, the NMOS transistor 103 and the PMOS transistor 105 are turned on, so that an output signal OUT of the buffer is at a 'high' logic level. Meanwhile, when the input signal IN has a low logic level, the PMOS transistor 102 and the NMOS transistor 106 are turned on, so that the output signal OUT of the buffer is at a 'low' logic level. Since the inverter-type buffer consumes a current only when a signal is input, it consumes a small amount of current, but recognizing a logic value of a high speed input signal, more specifically, a signal having a small swing width, may be difficult for the inverter-type buffer. FIG. 1A illustrates the most basic inverter-type buffer. However, the inverter-type buffer may have various structures different from FIG. 1A.

Referring to FIG. 1B, the amplifier-type buffer has a differential amplifier structure that detects a potential difference between an input signal IN and a reference voltage VREF. Two PMOS transistors 108 and 109 form a current mirror structure, so that the same current is supplied to nodes A and B, and the two nodes A and B are differentially amplified by the potential difference between the reference voltage VREF input to the NMOS transistor 110 and the input signal input to the NMOS transistor 111. As a consequence, when the input signal IN has a voltage higher than that of the reference voltage VREF, an output signal OUT has a 'high' logic level, and when the input signal IN has a level voltage than that of the reference voltage VREF, the output signal OUT has a 'low' logic level. The NMOS transistor 112 receiving an on/off signal ON/OFF is turned on when the on/off signal ON/OFF is at a 'high' logic level. When the NMOS transistor 112 is turned on, the buffer is activated, and when the NMOS transistor 112 is turned off, the buffer is deactivated. As a consequence, the amplifier-type buffer is activated when the on/off signal ON/OFF is at the 'high' logic level.

Such an amplifier-type buffer may accurately recognize the logic value of a signal even when the input signal IN has a small swing width (more specifically, the input signal is applied at a high speed), but consumes a large amount of current while the buffer is being activated because a current flows through the buffer when a signal is not applied. FIG. 1B illustrates the most basic amplifier-type buffer. However, the amplifier-type buffer may have various structures different from FIG. 1B.

SUMMARY

An embodiment of the present invention is directed to a channel that accurately receives a high speed signal and a low speed signal and reduces current consumption.

In accordance with an embodiment of the present invention, a system includes: an integrated circuit chip including a first buffer configured to receive signals and a second buffer configured to receive signals, wherein the first buffer receives signals of a higher frequency than the second buffer; a controller chip configured to control the integrated circuit chip; an I/O channel formed between the controller chip and the integrated circuit chip to transfer a first signal and a second speed signal, wherein the first signal has a higher frequency than the second signal; and a status channel formed between the controller chip and the integrated circuit chip to transfer at least one status signal, wherein the integrated circuit chip is configured to select one of the first buffer and the second buffer and actives the selected buffer in response to the at least one status signal and receive a signal transferred through the I/O channel.

In accordance with an embodiment of the present invention, an integrated circuit includes: an input pad configured to receive a first signal and a second signal, wherein the first signal has a higher frequency than the second signal; a first buffer connected to the input pad configured to receive the first signal; a second buffer connected to the input pad configured to receive the second signal; a status signal input unit configured to receive at least one status signal that includes information on a type of a signal input to the input pad; and a buffer control unit configured to select one of the first and second buffers and activate the selected buffer in response to the status signals.

In accordance with an embodiment of the present invention, a memory system includes: a memory including a first buffer configured to receive signals and a second buffer configured to receive signals, wherein the first buffer being configured to receives signals of a higher frequency than the second buffer; a controller configured to control the memory; an I/O channel formed between the memory and the controller to transfer a command, an address, and data; and a status channel formed between the controller and the memory to transfer at least one status signal indicating whether a signal input to the I/O channel should be received by the first or the second buffer, wherein the memory is configured to receive the signal of the I/O channel using the second buffer for a period when the command is input to the I/O channel and a period when the address is input to the I/O channel in response to the one or more status signals, and receive the signal of the I/O channel using the first buffer for a period when the data is input to the I/O channel.

In accordance with an embodiment of the present invention, an operation method of a memory system including a memory and a memory controller includes: applying an activated chip enable signal to the memory from the memory controller; activating a second buffer connected to an I/O channel of the memory in response to the activated chip enable signal; applying a deactivated command latch enable signal and a deactivated address latch enable signal to, the memory from the memory controller; and activating a first buffer and deactivating the second buffer in response to the deactivated command latch enable signal and the deactivated address latch enable signal, wherein the first buffer receives signals of a higher frequency than the second buffer.

In accordance with an embodiment of the present invention, a memory includes: an input pad that receives a command, an address, and data; a first buffer connected to the input pad; a second buffer connected to the input pad, wherein the first buffer being configured to receive signals of a higher frequency than the second buffer; a status signal input unit configured to receive at least one status signal representing whether a signal input to the input pad is the command, the address or the data; and a buffer control unit configured to control the signal input to the input pad to be received by selecting one of the first buffer and the second buffer and activate the selected buffer in response to the at least one status signal

DETAILED DESCRIPTION

Figure 1A:
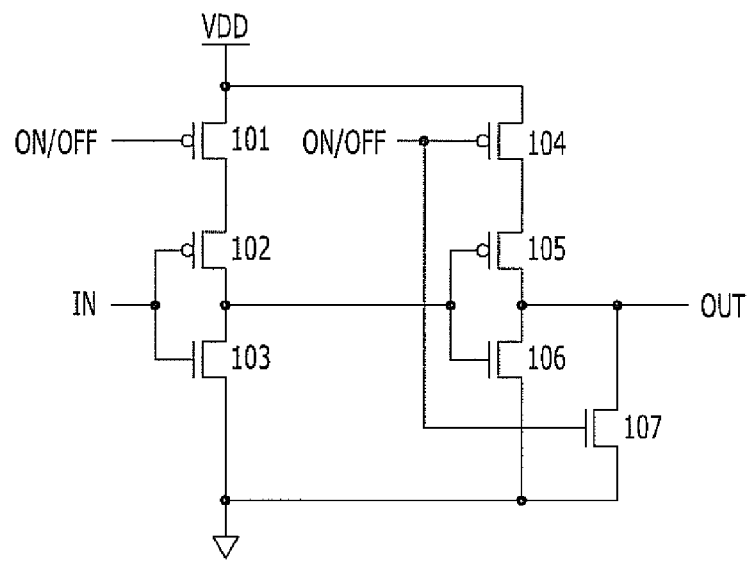
FIG. 1A is a diagram illustrating an inverter-type buffer, which is one of low speed-type buffers.
Figure 1B:
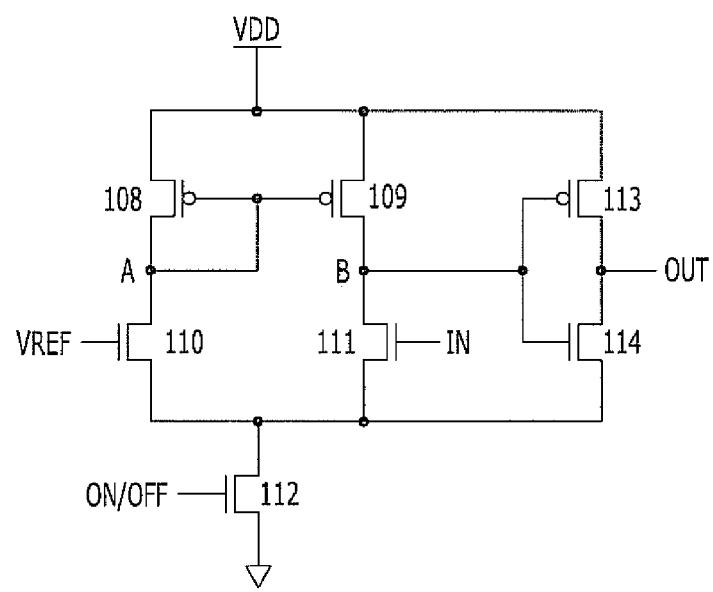
FIG. 1B is a diagram illustrating an amplifier-type buffer, which is one of high speed-type buffers.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
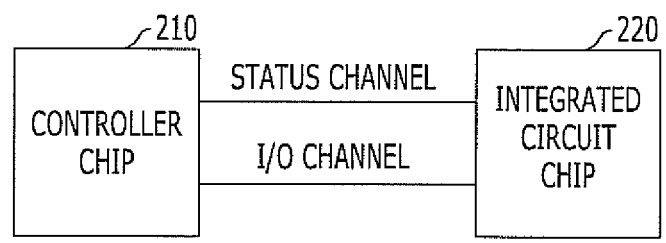
FIG. 2 is a configuration diagram of a system including an integrated circuit chip and a controller chip in accordance with an embodiment of the present invention.

FIG. 2 is a configuration diagram of a system including an integrated circuit chip and a controller chip in accordance with an embodiment of the present invention.

Referring to FIG. 2, the system includes an integrated circuit chip 220, a controller chip 210, an I/O channel I/O CHANNEL, and a status channel STATUS CHANNEL.

The integrated circuit chip 220 denotes a chip operating under the control of the controller chip 210. The integrated circuit chip 220 may include chips that transmit/receive a signal to/from the controller chip 210 under control of the controller chip 210. For example, the controller chip 210 may include a memory controller, and the integrated circuit chip 220 may include a memory operating under the control of the controller chip 210.

The I/O channel I/O CHANNEL allows a signal to be transferred from the controller chip 210 to the integrated circuit chip 220. A low speed (low frequency) signal and a high speed (high frequency) signal are transferred through the I/O channel I/O CHANNEL.

The status channel STATUS CHANNEL allows the controller chip 210 to report the type of a signal transferred to the integrated circuit chip 220 through the I/O channel I/O CHANNEL. More specifically, the status channel STATUS CHANNEL reports information regarding whether the signal transferred through the I/O channel I/O CHANNEL is a high speed signal or a low speed signal.

The integrated circuit chip 220 includes a low speed-type buffer and a high speed-type buffer (not illustrated) for receiving a signal of the I/O channel I/O CHANNEL. The integrated circuit chip 220 is configured to receive the signal of the I/O channel I/O CHANNEL using either the low speed-type buffer or the high speed-type buffer in response to a signal transferred through the status channel STATUS CHANNEL. When the signal transferred through the status channel STATUS CHANNEL indicates that the signal of the I/O channel I/O CHANNEL is a low speed signal, the integrated circuit chip 220 receives the signal of the I/O channel I/O CHANNEL using the low speed-type buffer. Meanwhile, when the signal transferred through the status channel STATUS CHANNEL indicates that the signal of the I/O channel I/O CHANNEL is a high speed signal, the integrated circuit chip 220 receives the signal of the I/O channel I/O CHANNEL using the high speed-type buffer.

More specifically, the integrated circuit chip 220 receives the signal of the I/O channel I/O CHANNEL using an appropriate buffer, which is either the low speed-type buffer or the high speed-type buffer, in response to the signal transferred through the status channel STATUS CHANNEL.

The bit number (line number) of the I/O channel I/O CHANNEL and the bit number (line number) of the status channel STATUS CHANNEL may be changed according to design.

Figure 3:
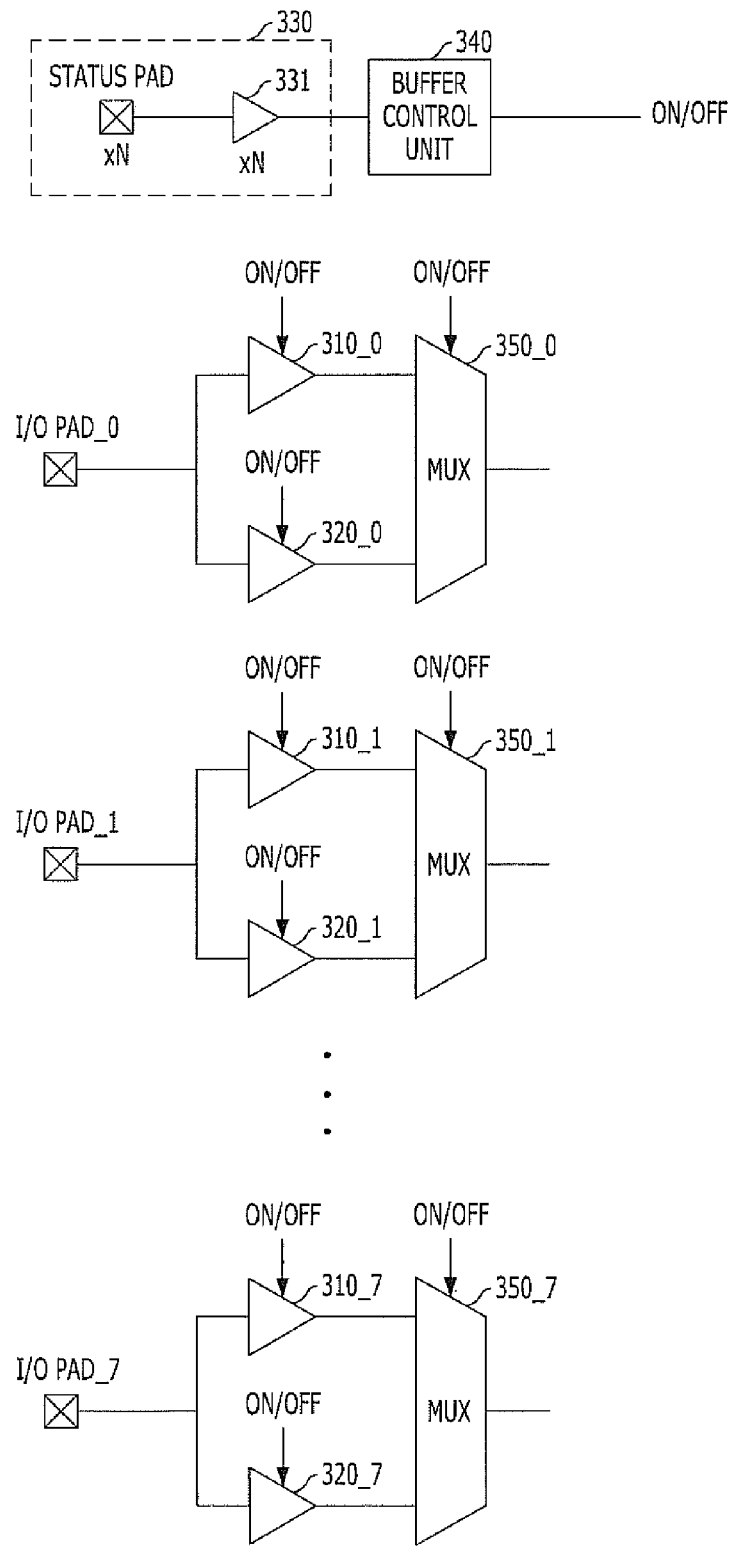
FIG. 3 is a configuration diagram of the integrated circuit chip 220 of FIG. 2 in accordance with an embodiment.

FIG. 3 is a configuration diagram of the integrated circuit chip 220 of FIG. 2 in accordance with the embodiment.

Referring to FIG. 3, the integrated circuit chip 220 includes a plurality of input pads I/O PAD_0 to 7, a plurality of high speed-type buffers 310_0 to 7, a plurality of low speed-type buffers 320_0 to 7, a status signal input unit 330, a buffer control unit 340, and a plurality of selection units 350_0 to 7.

The plurality of input pads I/O PAD_0 to 7 are configured to receive the signal of the I/O channel I/O CHANNEL. In FIG. 3, the number of input pads I/O PAD is 8, more specifically, the I/O channel I/O CHANNEL is 8 bits.

The plurality of high speed-type buffers 310_0 to 7 are configured to recognize both a high speed signal and a low speed signal, which are input to the input pads I/O PAD_0 to 7 corresponding to the high speed-type buffers 310_0 to 7, but consume a large amount of current. The plurality of low speed-type buffers 320_0 to 7 consume a small amount of current but do not recognize a high speed signal. The difference between the high speed-type buffer 310 and the low speed-type buffer 320 is relative. More specifically, the high speed-type buffer 310 may have relatively superior performance but consumes a large amount of current, and the low speed-type buffer 320 consumes a relatively small amount of current but has a poor performance. An amplifier-type buffer is an example of the high speed-type buffer 310, and an inverter-type buffer is an example of the low speed-type buffer 320.

The status signal input unit 330 is configured to receive one or more status signals STATUS SIGNALS input through the status channel STATUS CHANNEL. The status signal input unit 330 may include one or more status signal input pads STATUS PAD and one or more buffers 331 connected to the pads. FIG. 3 illustrates that the number of the status signal input pads STATUS PAD is N and the number of buffers 331 is N. Since the status signal STATUS SIGNAL provides information regarding the type of the signals input to the input pads I/O PAD_0 to 7, the status signals STATUS SIGNAL are not generally input to the status pads STATUS PAD at a high speed. Since the status signals STATUS SIGNALS are not input at a high speed, the buffers 331 of the status signal input unit 330 may be low speed-type buffers. Of course, if the status signals STATUS SIGNAL are input at a high speed, the buffers 331 of the status signal input unit 330 must be a high speed-type buffer.

The buffer control unit 340 is configured to activate either the low speed-type buffers 320_0 to 7 or the high speed-type buffers 310_0 to 7 in response to the status signals STATUS SIGNALS. When the status signal STATUS SIGNAL indicates that the signal input to the input pads I/O PAD_0 to 7 is a high speed signal, the buffer control unit 340 activates the high speed-type buffers 310_0 to 7. Meanwhile, when the status signal STATUS SIGNAL indicates that the signal input to the input pads I/O PAD_0 to 7 is a low speed signal, the buffer control unit 340 activates the low speed-type buffers 320_0 to 7. When an on/off signal ON/OFF output from the buffer control unit 340 is at a 'high' logic level, the high speed-type buffers 310_0 to 7 are activated. Meanwhile, When the on/off signal ON/OFF is at a 'low' logic level, the low speed-type buffers 320_0 to 7 are activated.

The plurality of selection units 350_0 to 7 are configured to select and output the output of the low speed-type buffers 320_0 to 7 while the low speed-type buffers 320_0 to 7 are activated, and select and output the output of the high speed-type buffers 310_0 to 7 while the high speed-type buffers 310_0 to 7 are activated. More specifically, the selection units 350_0 to 7 select the output of the low speed-type buffers 320_0 to 7 when the on/off signal ON/OFF is at a 'low' logic level, and select the output of the high speed-type buffers 310_0 to 7 when the on/off signal ON/OFF is at a 'high' logic level. The output of the selection units 350_0 to 7 is transferred to circuits in the integrated circuit.

Figure 4:
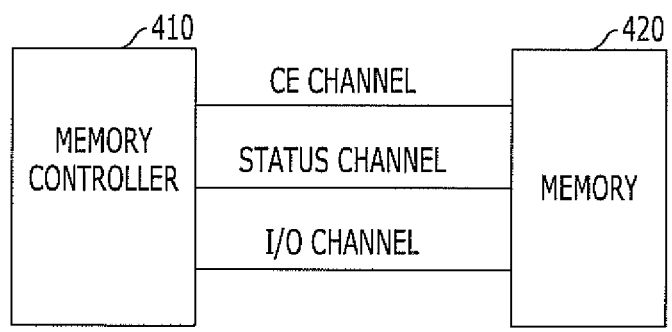
FIG. 4 is a configuration diagram of a memory system in accordance with an embodiment of the present invention.

FIG. 4 is a configuration diagram of a memory system in accordance with the embodiment of the present invention.

Referring to FIG. 4, the memory system includes a memory 420, a memory controller 410, an I/O channel I/O CHANNEL, a status channel STATUS CHANNEL, and a chip enable channel CE CHANNEL. The memory 420 in the memory system corresponds to the integrated circuit chip 220 of FIG. 2, and the memory controller 410 corresponds to the controller chip 210 of FIG. 2.

The memory 420 is configured to store data under the control of the memory controller 410. The memory system of the present invention can be applied to all kinds of memory systems that receive a high speed signal (data) and a low speed signal (a command or an address) through the I/O channel I/O CHANNEL. For illustration purposes, the following description will be given on the assumption that the memory 420 is a flash memory.

The I/O channel I/O CHANNEL allows data, an address, and a command to be transferred from the memory controller 410 to the memory 420. The data is transferred at a high speed (high frequency) through the I/O channel I/O CHANNEL, but the address and the command are transferred at a low speed (low frequency).

The status channel STATUS CHANNEL allows the transfer of a status signal that represents whether a signal transferred through the I/O channel I/O CHANNEL is data, an address, or a command. The status signal includes an address latch enable signal ALE and a command latch enable signal CLE. When the address latch enable signal ALE is activated to a 'high' logic level, the address latch enable signal ALE indicates that an address is transferred through the I/O channel I/O CHANNEL. When the command latch enable signal CLE is activated to a 'high' logic level, the command latch enable signal CLE indicates that a command is transferred through the I/O channel I/O CHANNEL. Furthermore, when both the address latch enable signal ALE and the command latch enable signal CLE are deactivated, the signals indicate that data is transferred through the I/O channel I/O CHANNEL. Consequently, whether the signal transferred through the I/O channel I/O CHANNEL is an address, a command, or data may be determined by using the address latch enable signal ALE and the command latch enable signal CLE.

The chip enable channel CE CHANNEL allows a chip enable signal CE to be transferred. When the chip enable signal CE is activated to a 'high' logic level, the chip enable signal CE indicates that the memory 420 has not been selected to operate. Meanwhile, when the chip enable signal CE is deactivated to a 'low' logic level, the chip enable signal CE indicates that the memory 420 has been selected to operate.

The memory 420 includes a low speed-type buffer and a high speed-type buffer (not illustrated) for receiving a signal of the I/O channel I/O CHANNEL. The memory 420 is configured to receive the signal of the I/O channel I/O CHANNEL using either the low speed-type buffer or the high speed-type buffer based on the address latch enable signal ALE and the command latch enable signal CLE that are transferred through the status channel STATUS CHANNEL. In an address input period and a command input period, the memory 420 receives the signal of the I/O channel I/O CHANNEL using the low speed-type buffer. In a data input period, the memory 420 receives the signal of the I/O channel I/O CHANNEL using the high speed-type buffer. Furthermore, when the chip enable signal CE is deactivated to a 'high' logic level, the memory 420 deactivates both the high speed-type buffer and the low speed-type buffer. The buffers are deactivated because no signals are input to the I/O channel I/O CHANNEL when the chip enable signal CE is deactivated to a 'high' logic level.

Figure 5:
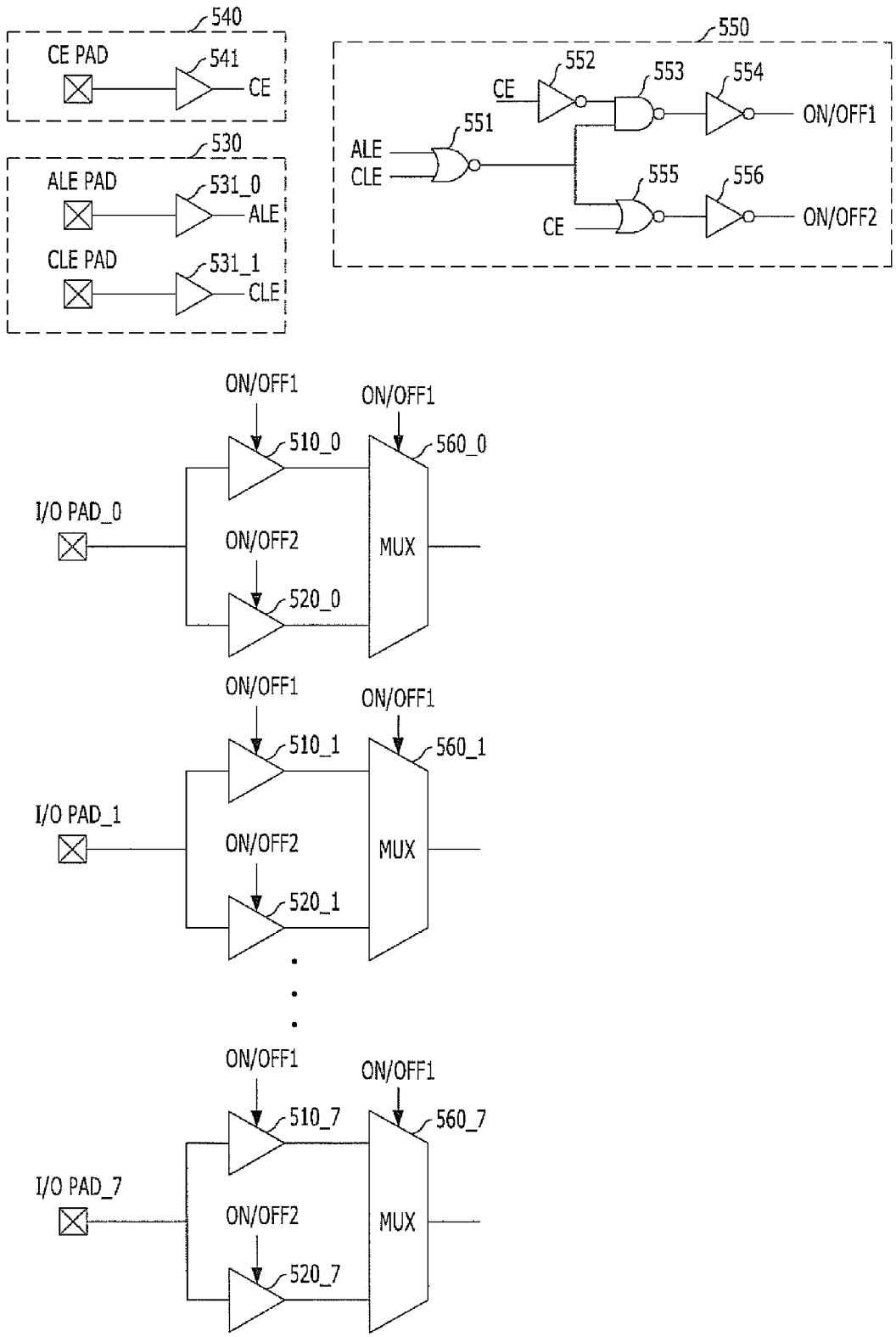
FIG. 5 is a configuration diagram of the memory 420 of FIG. 4 in accordance with an embodiment.

FIG. 5 is a configuration diagram of the memory 420 of FIG. 4 in accordance with the embodiment.

Referring to FIG. 5, the memory includes a plurality of input pads I/O PAD_0 to 7 that receive a command, an address, and data, a plurality of high speed-type buffers 510_0 to 7, a plurality of low speed-type buffers 520_0 to 7, a status signal input unit 530, a chip enable single input unit 540, a buffer control unit 550, and a plurality of selection units 560_0 to 7.

The plurality of input pads I/O PAD_0 to 7 are configured to receive the signal of the I/O channel I/O CHANNEL. A command, an address, and data are input to the plurality of input pads I/O PAD_0 to 7.

The plurality of high speed-type buffers 510_0 to 7 are configured to recognize both a high speed signal (data) and a low speed signal (an address and a command), which are input to the input pads I/O PAD_0 to 7, but consume a large amount of current. The plurality of high speed-type buffers 510_0 to 7 correspond to the high speed-type buffers 310_0 to 7 of FIG. 3. The plurality of low speed-type buffers 520_0 to 7 consume a small amount of current but do not recognize a high speed signal. The plurality of low speed-type buffers 520_0 to 7 correspond to the high speed-type buffers 320_0 to 7 of FIG. 3.

The status signal input unit 530 is configured to receive the address latch enable signal ALE and the command latch enable signal CLE, which are input to the status channel STATUS CHANNEL. The status signal input unit 530 may include an address latch enable pad ALE PAD, a command latch enable pad CLE PAD, and buffers 531_0 and 531_1.

The chip enable single input unit 540 is configured to receive the chip enable signal CE input to the chip enable channel CE CHANNEL. The chip enable single input unit 540 may include a chip enable pad CE PAD and a buffer 541.

The buffer control unit 550 is configured to control the activation/deactivation of the high speed-type buffers 510_0 to 7 and the low speed-type buffers 520_0 to 7 in response to the address latch enable signal ALE, the command latch enable signal CLE, and the chip enable signal CE. When both the address latch enable signal ALE and the command latch enable signal CLE are deactivated to a 'low' logic level, the buffer control unit 550 activates the high speed-type buffers 510_0 to 7. Meanwhile, when the address latch enable signal ALE or the command latch enable signal CLE is activated to a 'high' logic level, the buffer control unit 550 activates the low speed-type buffers 520_0 to 7. If both the address latch enable signal ALE and the command latch enable signal CLE are activated to a 'high' logic level, the buffer control unit 550 also activates the low speed-type buffers 520_0 to 7. When the chip enable signal CE is deactivated to a 'high' logic level, the buffer control unit 550 deactivates both the high speed-type buffers 510_0 to 7 and the low speed-type buffers 520_0 to 7. The buffer control unit 550 may include NOR gates 551 and 555, inverters 552, 554 and 556, and a NAND gate 553. A first on/off signal ON/OFF1 generated by the buffer control unit 550 is used to control the activation/deactivation of the high speed-type buffers 510_0 to 7. When the first on/off signal ON/OFF1 is at a 'high' logic level, the high speed-type buffers 510_0 to 7 are activated. Meanwhile, when the first on/off signal ON/OFF1 is at a 'low' logic level, the high speed-type buffers 510_0 to 7 are deactivated. Furthermore, a second on/off signal ON/OFF2 is used to control the activation/deactivation of the low speed-type buffers 520_0 to 7. When the second on/off signal ON/OFF2 is at a 'low' logic level, the low speed-type buffers 520_0 to 7 are activated. Meanwhile, when the second on/off signal ON/OFF2 is at a 'high' logic level, the low speed-type buffers 520_0 to 7 are deactivated.

Table 1 below illustrates the operation of the buffer control unit 550.

TABLE 1

| CE | ALE | CLE | ON/OFF1 | ON/OFF2 | Buffer to be activated |
|---|---|---|---|---|---|
| L | H | L | L | L | low speed-type buffer |
| L | L | H | L | L | low speed-type buffer |
| L | H | H | L | L | low speed-type buffer |
| L | L | L | H | H | high speed-type buffer |
| H | don't care | don't care | L | H | All buffers |

The plurality of selection units 560_0 to 7 are configured to select and output the output of the low speed-type buffers 520_0 to 7 while the low speed-type buffers 520_0 to 7 are being activated, and select and output the output of the high speed-type buffers 510_0 to 7 while the high speed-type buffers 510_0 to 7 are being activated. More specifically, when the first on/off signal ON/OFF1 is at a 'low' logic level, the selection units 560_0 to 7 select the output of the low speed-type buffers 520_0 to 7. Meanwhile, while the first on/off signal ON/OFF1 is at a 'high' logic level, the selection units 560_0 to 7 select the output of the high speed-type buffers 510_0 to 7. The output of the selection units 560_0 to 7 is transferred to circuits in the memory 420.

Figure 6:
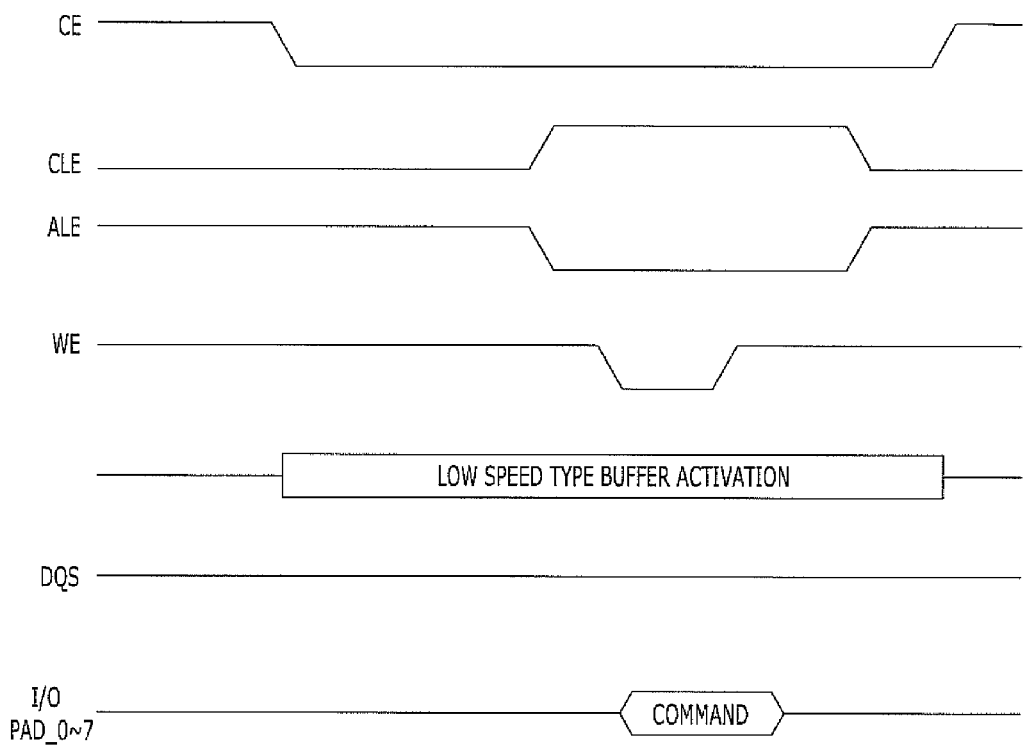
FIGS. 6 to 8 are timing diagrams illustrating the operation of the system of FIG. 4.
Figure 7:
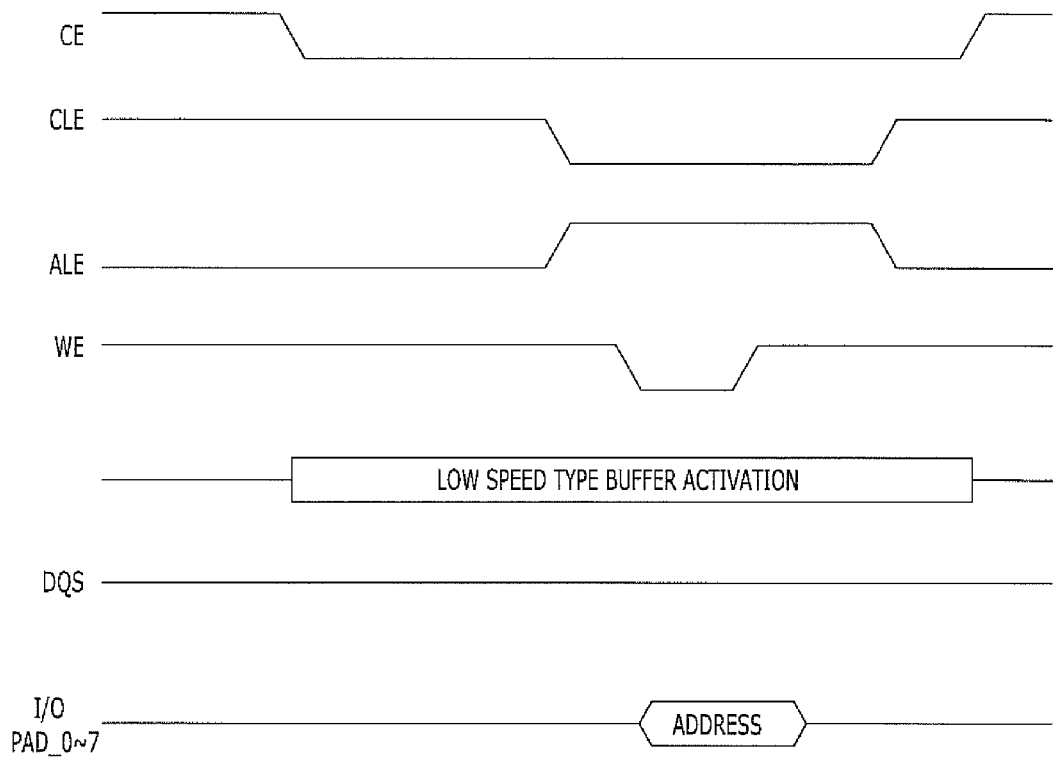
Figure 8:
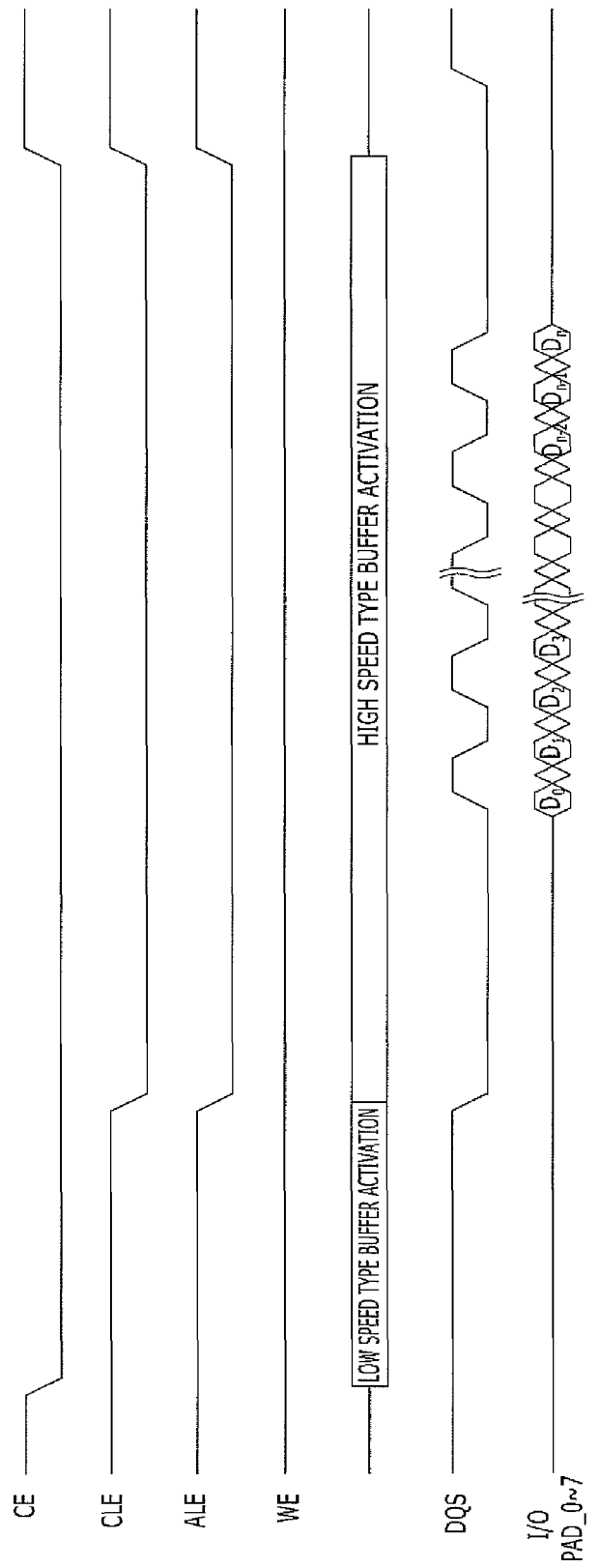

FIGS. 6 to 8 illustrate the operation of the system of FIG. 4.

FIG. 6 is a diagram illustrating a command being transferred from the memory controller 410 to the memory 420. Referring to FIG. 6, when the chip enable signal CE is activated to a 'low' logic level, the low speed-type buffers 520_0 to 7 are activated. In the period when the command latch enable signal CLE is activated to a 'high' logic level, a command is input through the I/O pads I/O PAD_0 to 7. A write enable signal WE is activated to a 'low' logic level when the command is applied. The write enable signal WE is used to strobe a command and an address input to the I/O pad I/O PAD. When the chip enable signal CE is deactivated to a 'high' logic level after the input of the command is completed, the low speed-type buffers 520_0 to 7 are deactivated.

FIG. 7 is a diagram illustrating an address being transferred from the memory controller 410 to the memory 420. Referring to FIG. 7, when the chip enable signal CE is activated to a 'low' logic level, the low speed-type buffers 520_0 to 7 are activated. In the period when the address latch enable signal ALE is activated to a 'high' logic level, an address is input through the I/O pads I/O PAD_0 to 7. The write enable signal WE is activated to a 'low' logic level when the address is applied. When the chip enable signal CE is deactivated to a 'high' logic level after the input of the address is completed, the low speed-type buffers 520_0 to 7 are deactivated.

Referring to FIGS. 6 and 7, during a period when the command is input to the memory 420 and during a period when the address is input to the memory 420, signals of the I/O pads I/O PAD_0 to 7 are input through the low speed-type buffers 520_0 to 7.

FIG. 8 is a diagram illustrating a timing at which data $D_0$ to $D_N$ is transferred from the memory controller 410 to the memory 420. Referring to FIG. 8, when the chip enable signal CE is activated to a 'low' logic level, the low speed-type buffers 520_0 to 7 are activated. When both the address latch enable signal ALE and the command latch enable signal CLE are deactivated to a 'low' logic level, the high speed-type buffers 510_0 to 7 are activated. When the high speed-type buffers 510_0 to 7 are activated, a data strobe signal DQS is toggled, and data $D_0$ to $D_N$ is input through the I/O pads I/O PAD_0 to 7 in synchronization with the data strobe signal DQS. When the chip enable signal CE is deactivated to a 'high' logic level after the input of the data $D_0$ to $D_N$ is completed, the high speed-type buffers 510_0 to 7 are deactivated.

FIG. 8 illustrates that the chip enable signal CE is deactivated after the input of the data $D_0$ to $D_N$ is completed. However, when logic values of the address latch enable signal ALE and the command latch enable signal CLE are changed before the chip enable signal CE is deactivated, that is, when one or more of the two signals ALE and CLE are activated, the low speed-type buffers 520_0 to 7 are activated.

According to the present invention, a high speed-type buffer is activated during a period when a high speed signal is input to an input pad of an integrated circuit or a memory, and a low speed-type buffer is activated during a period when a low speed signal is input thereto. Consequently, the high speed signal and the low speed signal may be stably received while consuming a small amount of current.

While the present invention has been described with respect to the specific embodiments, it will be apparent to those skilled in the art that various changes and modifications may be made without departing from the spirit and scope of the invention as defined in the following claims.

What is claimed is:

1. A system comprising:
   an integrated circuit chip including a first buffer configured to receive signals and a second buffer configured to receive signals, wherein the first buffer receives signals of a higher frequency than the second buffer;
   a controller chip configured to control the integrated circuit chip;
   an I/O channel formed between the controller chip and the integrated circuit chip to transfer a first signal and a second signal, wherein the first signal has a higher frequency than the second signal; and
   a status channel formed between the controller chip and the integrated circuit chip to transfer at least one status signal,
   wherein the integrated circuit chip is configured to select one of the first buffer and the second buffer and actives the selected buffer in response to the at least one status signal and receive a signal transferred through the I/O channel.

2. The system of claim 1, wherein the status channel is configured to receive the at least one status signal including information regarding whether the signal transferred through the I/O channel is a first signal.

3. The system of claim 1, wherein the first buffer is an amplifier-type buffer and the second buffer is an inverter-type buffer.

4. An integrated circuit comprising:
   an input pad configured to receive a first signal and a second signal, wherein the first signal has a higher frequency than the second signal;
   a high speed-type buffer connected to the input pad configured to receive the first signal;
   a low speed-type buffer connected to the input pad configured to receive the second signal;
   a status signal input unit configured to receive at least one status signal that includes information on a type of a signal input to the input pad; and
   a buffer control unit configured to select one of the high speed-type and low speed-type buffers and activate the selected buffer in response to the status signals.

5. The integrated circuit of claim 4, wherein the buffer control unit is configured to control the high speed-type buffer to be activated in a period when the first signal is input to the input pad, and control the low speed-type buffer to be activated in a period when the second signal is input to the input pad.

6. The integrated circuit of claim 5, wherein, when the integrated circuit is deactivated, the buffer control unit is configured to deactivates the high speed-type buffer and the low speed-type buffer.

7. The integrated circuit of claim 4, wherein the high speed-type buffer is an amplifier-type buffer and the low speed-type buffer is an inverter-type buffer.

8. The integrated circuit of claim 4, further comprising a plurality of input pads each connected to a high speed-type and low speed-type buffer.

9. A memory system comprising:
   a memory including a first buffer configured to receive signals and a second buffer configured to receive signals, wherein the first buffer being configured to receives signals of a higher frequency than the second buffer;
   a controller configured to control the memory;
   an I/O channel formed between the memory and the controller to transfer a command, an address, and data; and
   a status channel formed between the controller and the memory to transfer at least one status signal indicating whether a signal input to the I/O channel should be received by the first or the second buffer,
   wherein the memory is configured to receive the signal of the I/O channel using the second buffer for a period when the command is input to the I/O channel and a period when the address is input to the I/O channel in response to the one or more status signals, and receive the signal of the I/O channel using the first buffer for a period when the data is input to the I/O channel.

10. The memory system of claim 9, wherein the at least one status signal includes a command latch enable signal and an address latch enable signal, and
    the memory is configured to receive the signal of the I/O channel using the first buffer when the command latch enable signal and the address latch enable signal are deactivated, and receive the signal of the I/O channel using the second buffer when at least one of the command latch enable signal and the address latch enable signal are activated.

11. The memory system of claim 10, further comprising:
    a chip enable channel formed between the memory and the controller to transfer a chip enable signal for activating the memory,
    wherein the memory is configured to deactivate the first buffer and the second buffer when the chip enable signal is deactivated.

12. The memory system of claim 9, wherein the memory includes a nonvolatile memory.

13. An operation method of a memory system including a memory and a memory controller, comprising:
    applying an activated chip enable signal to the memory from the memory controller;
    activating a second buffer connected to an I/O channel of the memory in response to the activated chip enable signal;
    applying a deactivated command latch enable signal and a deactivated address latch enable signal to the memory from the memory controller; and
    activating a first buffer and deactivating the second buffer in response to the deactivated command latch enable signal and the deactivated address latch enable signal, wherein the first buffer receives signals of a higher frequency than the second buffer.

14. The method of claim 13, further comprising, after the first buffer is activated and the second buffer is deactivated:
   deactivating the first buffer and activating the second buffer when at least one of the command latch enable signal and the address latch enable signal are activated.

15. The method of claim 14, further comprising, after the first buffer is deactivated and the second buffer is activated:
   deactivating the second buffer when the chip enable signal is deactivated.

16. A memory comprising:
   an input pad that receives a command, an address, and data;
   a high speed-type buffer connected to the input pad;
   a low speed-type buffer connected to the input pad, wherein the high speed-type buffer being configured to receive signals of a higher frequency than the low speed-type buffer;
   a status signal input unit configured to receive at least one status signal representing whether a signal input to the input pad is the command, the address or the data; and
   a buffer control unit configured to control the signal input to the input pad to be received by selecting one of the high speed-type buffer and the low speed-types buffer and activate the selected buffer in response to the at least one status signal.

17. The memory of claim 16, wherein the buffer control unit is configured to control the signal input to the input pad to be received using the low speed-type buffer in a period when the address is input to the input pad and a period when the command is input to the input pad, and control the signal input to the input pad to be received using the high speed-type buffer in a period when the data is input to the input pad.

18. The memory of claim 17, further comprising:
   a chip enable signal input unit configured to receive a chip enable signal for activating the memory,
   wherein the buffer control unit is configured to deactivate the high speed-type buffer and the low speed-type buffer when the chip enable signal is deactivated.

19. The memory of claim 17, wherein the at least one status signal includes a command latch enable signal and an address latch enable signal, and
   a period when the command latch enable signal is activated is a period when the command is input to the input pad, a period when the address latch enable signal is activated is a period when the address is input to the input pad, and a period when the command latch enable signal and the address latch enable signal are deactivated is a period when the data is input to the input pad.

20. The memory of claim 16, wherein the memory includes a nonvolatile memory.

21. The memory of claim 16, further comprising a plurality of input pads each connected to a high speed-type and low speed-type buffer.

* * * * *